United States Patent [19]
Yonaga et al.

[11] Patent Number: 5,420,823
[45] Date of Patent: May 30, 1995

[54] SEMICONDUCTOR MEMORY WITH IMPROVED POWER SUPPLY CONTROL CIRCUIT

[75] Inventors: Takeru Yonaga; Jouji Ueno; Junichi Suyama, all of Tokyo, Japan

[73] Assignee: Oki Electric Industry Co., Ltd., Tokyo, Japan

[21] Appl. No.: 115,023

[22] Filed: Sep. 2, 1993

[30] Foreign Application Priority Data

Sep. 4, 1992 [JP] Japan ................................. 4-237125

[51] Int. Cl.$^6$ .............................................. G11C 7/00
[52] U.S. Cl. .................................... 365/226; 365/205
[58] Field of Search ................... 365/205, 226, 149; 307/279

[56] References Cited
U.S. PATENT DOCUMENTS 4,780,852 10/1988 Kajigaya et al. ................. 365/205
5,051,957 9/1991 Yamauchi ......................... 365/205
5,258,950 11/1993 Murashima et al. .............. 365/226

FOREIGN PATENT DOCUMENTS 0113999 5/1988 Japan ................................ 365/205

*Primary Examiner*—Eugene R. LaRoche
*Assistant Examiner*—Son Dinh
*Attorney, Agent, or Firm*—Spencer, Frank & Schneider

[57] ABSTRACT

A semiconductor memory has sense amplifiers which are supplied with a first potential from a first supply line and a second potential from a second supply line. A switching element on the first supply line is controlled by the potential of the second supply line, its conductivity increasing as the potential of the second supply line moves toward the second potential. A similar switching element, controlled by the potential of the first supply line, can be provided on the second supply line.

42 Claims, 4 Drawing Sheets

SEMICONDUCTOR MEMORY WITH IMPROVED POWER SUPPLY CONTROL CIRCUIT

BACKGROUND OF THE INVENTION

1. Field of the Invention

The present invention relates t,o a semiconductor memory. More particularly, the present invention relates to the circuits that control the supply of power to the sense amplifiers in a semiconductor memory.

2. Description of the Related Art

Sense amplifiers have the job of amplifying small potential differences between pairs of bit lines. In a conventional memory the sense amplifiers are powered from a pair of supply lines that are coupled to a power supply node and a ground node through respective transistors. When these transistors are switched off, the supply lines are precharged to one-half the power-supply potential. When the transistors are switched on, the supply-line potentials diverge toward the power-supply potential and ground. The sense amplifiers are adapted so that the potentials of each pair of bit lines likewise diverge, the bit line that was originally higher being pulled lip to the power-supply potential while the bit line that was originally lower is pulled down toward ground.

A problem with the conventional scheme is that it provides no assurance that the two supply-line potentials will diverge uniformly. In particular, any timing difference between the signals that control the above two transistors is translated directly into a timing difference between the waveforms on the supply lines, as a result of which the pull-up and pull-down circuits the sense amplifiers fail t,o operate with coordinated timing.

SUMMARY OF THE INVENTION

It is accordingly an object of the present invention to supply two potentials with similarity timing to the sense amplifiers of a semiconductor memory.

The invented semiconductor memory comprises a plurality of memory cells, a plurality of bit lines, and a plurality of sense amplifiers for amplifying potential differences between pairs of bit lines, the potential differences arising from data stored in the memory cells. The sense amplifiers are powered by a first supply line that supplies a first potential and a second supply line that supplies a second potential. A switching element supplies the first potential to the first supply line in response to the potential of the second supply line. The conductivity of this switching element increases as the potential of the second supply line moves toward the second potential.

DETAILED DESCRIPTION OF THE INVENTION

Figure 1:
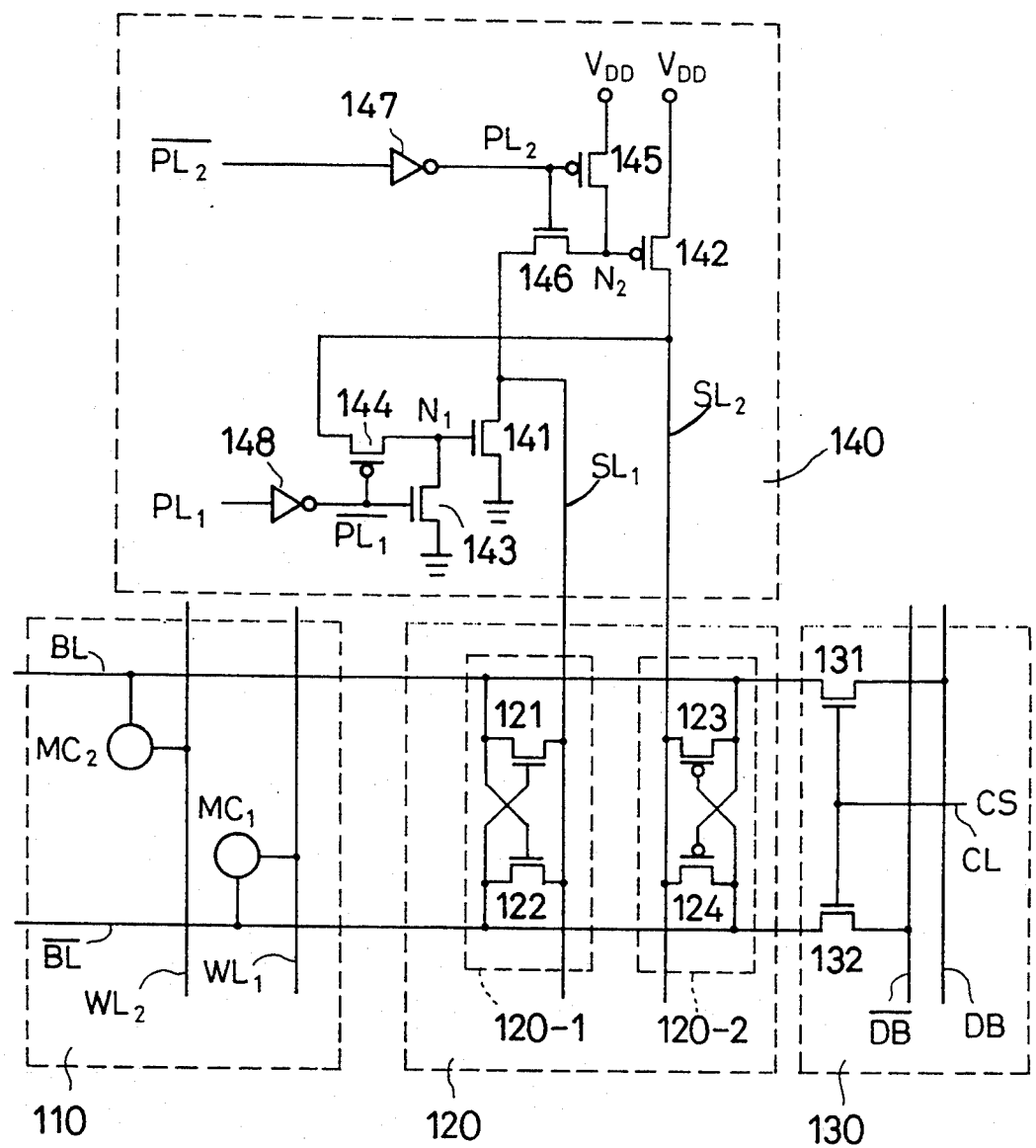
FIG. 1 is a schematic diagram showing a semiconductor memory with a novel circuit for powering sense amplifiers.

Embodiments of the invention will be described with reference to the attached drawings. The drawings illustrate the invention but do not, restrict its scope, which should be determined solely from the appended claims.

All transistors shown in the drawings are n-channel or p-channel field-effect transistors. As is well known, n-channel transistors conduct when their gate potential is higher than their source potential by at least a certain amount, while p-channel transistors conduct when their gate potential is lower than their source potential by at least a certain amount. In both cases, conductivity increases as the potential difference between the gate and source electrodes increases.

Referring to FIG. 1, the invented memory comprises a memory cell array 110, a sense amplifier array 120, a column selector 130, and a power supply control circuit 140. The memory cell array 110, sense amplifier array 120, and column selector 130 are well-known circuits, so they will be described only briefly.

The memory cell array 110 comprises a plurality of memory cells coupled to bit lines running in one direction and word lines running in a perpendicular direction. The drawing shows only two memory cells $MC_1$ and $MC_2$ coupled to two bit lines BL and $\overline{BL}$ and two word lines $WL_1$ and $WL_2$, but the numbers of memory cells, bit lines, and word lines may of course be larger than two.

The sense amplifier array 120 has one sense amplifier for each pair of bit, lines; accordingly, only one sense amplifier is shown in the drawing this sense amplifier consists of a pull-down section 120-1 comprising a pair of n-channel transistors 121 and 122 cross-coupled to the bit lines BL and $\overline{BL}$, and a pull-up section 120-2 comprising a pair of p-channel transistors also cross-coupled to the bit lines BL and $\overline{BL}$. The source electrodes of the n-channel transistors 121 and 122 are coupled to a first, supply line $SL_1$. The source electrodes of the p-channel transistors 123 and 124 are coupled to a second supply line $SL_2$.

The column selector 130 comprises a pair of n-channel transistors 131 and 132 coupling the bit lines BL and $\overline{BL}$ to respective data bus lines DB and $\overline{DB}$. Both transistors 131 and 132 are controlled by a column select signal CS that is applied to their gate electrodes via a column select signal line CL. A separate column select signal and pair of transistors is provided for each pair of bit, lines.

The power supply control circuit 140 supplies a first potential to the first supply line $SL_1$ and a second potential to the second supply line $SL_2$. Here the first potential is a ground potential (zero volts), denoted by the ground symbol in the drawings. The second potential is a higher potential such as three volts or five volts, denoted $V_{DD}$. The ground potential is supplied to the first supply line $SL_1$ through a first switching element, which is an n-channel transistor 141 having its source electrode coupled to ground, its drain electrode coupled to the first supply line $SL_1$, and its gale electrode coupled to a first node $N_1$. $V_{DD}$ is supplied to the second supply line $SL_2$ through a second switching element, which is a p-channel transistor 142 having its source electrode coupled to $V_{DD}$, its drain electrode coupled to the second supply line $SL_2$, and its gate electrode coupled to a second node $N_2$.

Node $N_1$ is coupled to a first switching circuit comprising an n-channel transistor 143 and a p-channel transistor 144. The source elect, rode of the n-channel transistor 143 is coupled to ground. The source electrode of the p-channel transistor 144 is coupled to the second supply line $SL_2$. The drain electrodes of both transistors 143 and 144 are coupled to node $N_1$. The gate electrodes of both transistors 143 and 144 receive a first control signal $\overline{PL_1}$, the bar indicating that this control signal is active low. Node $N_1$ is accordingly coupled to the second supply line $SL_2$ when $\overline{PL_1}$ is active, and to ground when $\overline{PL_1}$ is inactive.

Node $N_2$ is coupled to a second switching circuit comprising a p-channel transistor 145 and an n-channel transistor 146. The source electrode of the p-channel transistor 145 is coupled to $V_{DD}$. The source electrode of the n-channel transistor 146 is coupled to the first supply line $SL_1$. The drain electrodes of both transistors 145 and 146 are coupled to node $N_2$, and their gate electrodes both receive a second control signal $PL_2$, which is active high. Node $N_2$ is coupled to the first supply line $SL_1$ when $PL_2$ is active, and to $V_{DD}$ when the $PL_2$ is inactive.

The control signals $\overline{PL_1}$ and $PL_2$ are generated, for example, by inverters 147 and 148 that invert complementary control signals $PL_1$ and $\overline{PL_2}$, $PL_1$ being active high and $\overline{PL_2}$ active low.

Next the operation of the memory in FIG. 1 will be described with reference to the waveforms in FIG. 2.

Figure 2:
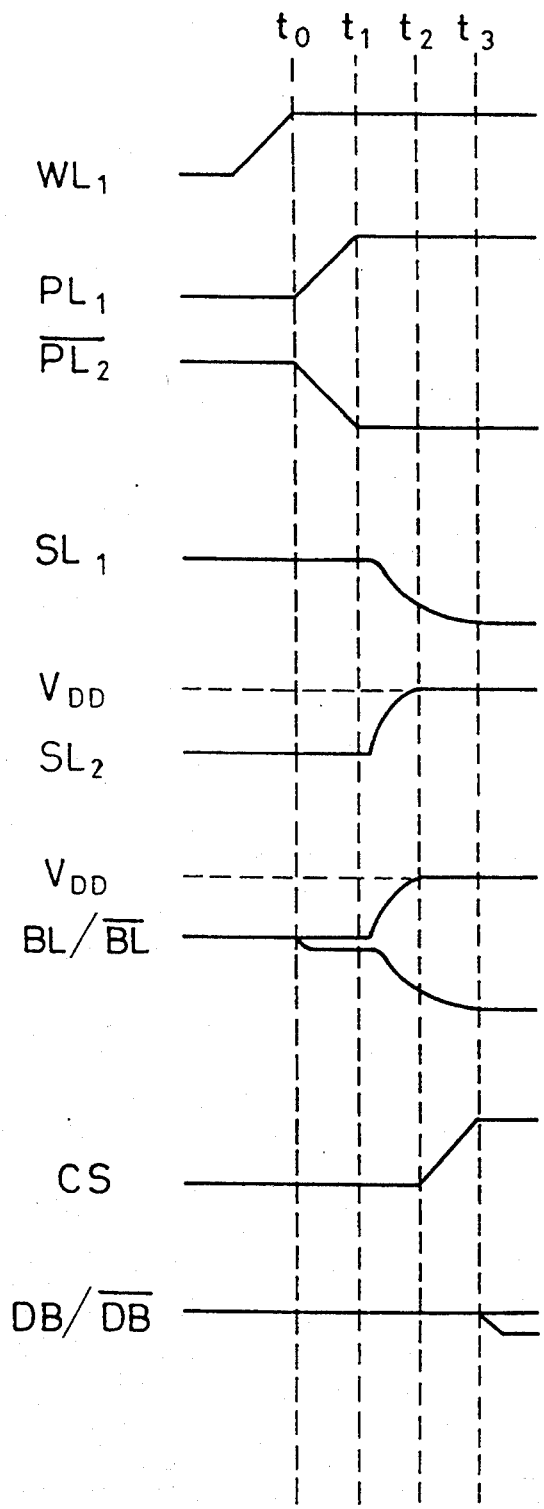
FIG. 2 is a timing diagram illustrating the operation of the memory in FIG. 1.

In the initial state in FIG. 2, the bit lines BL and $\overline{BL}$ are both precharged to one-half the power-supply potential ($V_{DD}/2$) by a circuit not shown in the drawings. At this level the transistors in the sense amplifier array 120 all conduct, although not with their maximum conductivity. The control signals $PL_1$ and $\overline{PL_2}$ are both inactive, so $\overline{PL_1}$ and $PL_2$ are likewise inactive, node $N_1$ is coupled to ground, and node $N_2$ is coupled to $V_{DD}$. The n-channel transistors 141 and 146 and p-channel transistors 142 and 144 are all in the off state, so the supply lines $SL_1$ and $SL_2$ are decoupled from the power supply control circuit 140 and charge through the sense amplifiers to the same $V_{DD}/2$ potential as the bit lines.

At time $t_0$ one of the word lines is driven to the active (high) state. For example, word line $WL_1$ is driven high, coupling memory cell $MC_1$ to bit line $\overline{BL}$. The charge stored in this memory cell pulls bit line $\overline{BL}$ up or down slightly from its precharge level of $V_{DD}/2$. In the drawing, $\overline{BL}$ is pulled down slightly from $V_{DD}/2$.

At time $t_1$ control signals $PL_1$ and $\overline{PL_2}$ become active, coupling node $N_1$ to the second supply line $SL_2$ and node $N_2$ to the first supply line $SL_1$. Since the supply lines $SL_1$ and $SL_2$ are both at $V_{DD}/2$, transistors 141 and 142 both conduct, although not with their maximum conductivity, coupling the first supply line $SL_1$ to ground and the second supply line $SL_2$ to $V_{DD}$. The potential of the first supply line $SL_1$ therefore begins to fall toward ground, while the potential of the second supply line $SL_2$ begins to rise toward $V_{DD}$.

As $SL_1$ and $SL_2$ diverge toward ground and $V_{DD}$, respectively the gate-source voltage, hence the conductivity, of transistors 141 and 142 increases. Moreover, since each supply line controls the conductivity of the transistor on the other supply line, the divergence is self-regulating. If the second supply line $SL_2$, for example, approaches $V_{DD}$ faster than the first supply line $SL_1$ is approaching ground, the n-channel transistor 141 will become more conductive than the p-channel transistor 142, and $SL_1$ will tend to catch up with $SL_2$.

Similarly, if $SL_1$ approaches ground faster than $SL_2$ approaches $V_{DD}$, then the p-channel transistor 142 will become more conductive than the n-channel transistor 141, and $SL_2$ will tend to catch up.

As $SL_1$ and $SL_2$ diverge toward ground and $V_{DD}$, respectively the sense amplifier causes the bit lines BL and $\overline{BL}$ to diverge similarly, the bit line that was originally higher (in this case BL) going toward $V_{DD}$ while the bit line that was lower ($\overline{BL}$) goes toward ground. This process is substantially completed at time $t_2$.

At time $t_3$ the chip select signal CS becomes active, coupling the bit lines BL and $\overline{BL}$ to the data bus lines DB and $\overline{DB}$. The potentials on the data bus lines then begin to diverge. After suitable amplification, the potential on one of the data bus lines is supplied to an output lead (not shown in the drawings) as the value of the data stored in memory cell $MC_1$.

In FIG. 2 the control signals $PL_1$ and $\overline{PL_2}$ are shown rising and falling simultaneously, but the self-regulating effect described above operates even if the rise and fall of $PL_1$ and $\overline{PL_2}$ are not simultaneous. For example, if $\overline{PL_2}$ becomes active before $PL_1$, so that the second supply line $SL_2$ begins charging toward $V_{DD}$ while the first supply line $SL_1$ is still held at $V_{DD}/2$, the gate electrode of the p-channel transistor 142 will stay at $V_{DD}/2$, so the second supply line $SL_2$ will not charge too rapidly. Then when $PL_1$ does become active, the gate electrode of the n-channel transistor 141 will immediately be switched to a potential higher than $V_{DD}/2$, so it will be more conductive than the p-channel transistor 142, and the first supply line $SL_1$ will discharge toward ground faster than the second supply line $SL_2$ is charging toward $V_{DD}$.

FIG. 2 is a conceptual drawing; the exact shape of the waveforms may differ from that shown, and the intervals between $t_0$, $t_1$, $t_2$, and $t_3$ may also differ. In particular, the rise and fall of the supply lines and bit lines between times $t_1$ and $t_2$ may take considerably more time than the rise and fall of the control signals $PL_1$ and $\overline{PL_2}$ between times $t_0$ and $t_1$, or the rise of the column select signal CS between times $t_2$ and $t_3$.

To limit power dissipation and for other reasons, many semiconductor memories have circuits that reduce the external supply voltage to a lower internal voltage, which is supplied to the sense amplifiers and memory cell array. Accordingly, two supply voltages are available for use: the original external voltage, which will be denoted $V_{DD}$, and the reduced internal supply voltage, which will be denoted $V'_{DD}$.

In such a memory the second supply line $SL_2$ must be brought to $V'_{DD}$, but the reduced level of $V'_{DD}$ as compared with $V_{DD}$ causes $SL_2$ to charge at a slower rate. Since $VD_{DD}$ is available, however, the second supply line $SL_2$ can be brought up to $V'_{DD}$ quickly by feeding both $V_{DD}$ and $V'_{DD}$ to $SL_2$ while $SL_2$ is charging, then cutting off the $V_{DD}$ supply after $SL_2$ reaches $V'_{DD}$.

Figure 3:
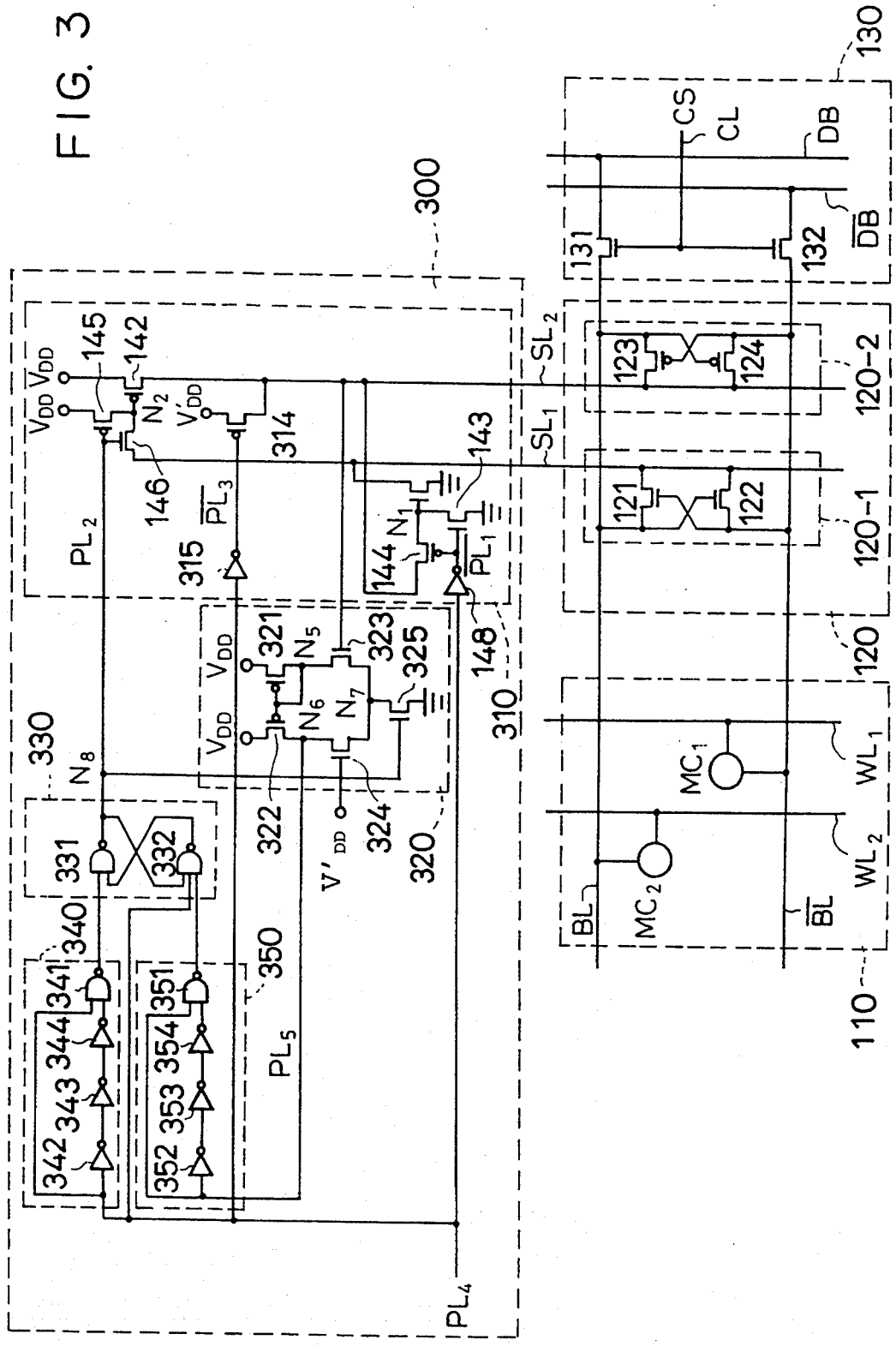
FIG. 3 is a schematic diagram showing a semiconductor memory with another novel circuit for powering sense amplifiers.

FIG. 3 shows the invented semiconductor memory modified so as to operate in this way. The memory cell array 110, sense amplifier array 120, and column selector 130 are the same as in FIG. 1, but the power supply control circuit 300 now comprises a power switching circuit 310, a current-mirror amplifier 320, a set-reset flip-flop 330, and a pair of one-shot circuits 340 and 350.

The power switching circuit 310 has many elements in common with the power supply control circuit 140 in FIG. 1, and these are denoted by the same reference numerals. The inverter 147 on the $PL_2$ line in FIG. 1 has been removed, and a third switching element coupling the second supply line SL₂ to V'$_{DD}$ has been added. The third switching element is a p-channel transistor 314 having its source electrode coupled to V'$_{DD}$ and its drain electrode coupled to the second supply line SL₂. The gate electrode of the p-channel transistor 314 receives a third control signal $\overline{PL_3}$, which is output by an inverter 315 that receives a fourth control signal PL₄. The fourth control signal PL₄ is also supplied to the inverter 148, so that both the first and third control signals $\overline{PL_1}$ and $\overline{PL_3}$ are generated from PL₄. The second control signal PL₂ is generated as will be described later.

The current-mirror amplifier 320 is a well-known circuit comprising a pair of p-channel, transistors 321 and 322 having their source electrodes coupled to V$_{DD}$ and their drain electrodes coupled to respective nodes N₅ and N₆. The gate electrodes of both transistors 321 and 322 are coupled to node N₅. A pair of n-channel transistors 323 and 324 are coupled between these nodes N₅ and N₆ and another node N₇. The gate electrode of the n-channel transistor 323 is coupled to the second supply line SL₂. The gate electrode of the n-channel transistor 324 is coupled to V'$_{DD}$. Node N₇ is coupled through another n-channel transistor 325 to ground. The gate electrode of the n-channel transistor 325 is coupled to a node N₈ from which the second control signal PL₂ is supplied to the power switching circuit 310.

The operation of current-mirror amplifiers is well known, so only a brief description will be given here. When node N₈ is low, the current-mirror amplifier 320 is switched off. When node N₈ is high and the potential of the second supply line SL₂ is lower than V'$_{DD}$, current in the current mirror flows mainly through transistors 322 and 324, node N₅ is high, and node N₆ is low. When node N₈ is high and the potential of the second supply line SL₂ is higher than V'$_{DD}$, current flows mainly through transistors 321 and 323, node N₅ goes low, and node N₆ goes high. The output of the current-mirror amplifier 320 is a fifth control signal PL₅, which is taken from node N₆.

The one-shot circuit 340 comprises a two-input NAND gate 341, to one input of which three inverters 342, 343, and 344 are coupled in series. The fourth control signal PL₄ is supplied to the first inverter 342 and to the other input of the NAND gate 341. This well-known circuit produces an output signal that is normally high, but goes low for a brief interval at each low-to-high (inactive-to-active) transition of the fourth control signal PL₄. This low output signal will be referred to below as a set pulse.

The one-shot circuit 350 is a similar circuit comprising a NAND gate 351 and three inverters 352, 353, and 354. Its input signal is the fifth control signal PL₅ from node N₆. Its output signal, which goes low briefly at each low-to-high (inactive-to-active) transition of PL₅, will be referred to below as a reset pulse.

The set-reset flip-flop 330 is a well-known circuit comprising a pair of cross-coupled NAND) gates 331 and 332. The output of the one-shot circuit 340 is supplied as an input to the NAND gate 331. The output of the one-shot circuit 350 is supplied as an input to the NAND gate 332. The fourth control signal PL₄ is also supplied as an input to the NAND gate 332. As long as all three of these inputs are high, the output of the flip-flop 330, which is the output of the NAND gate 331, remains in its existing state. When the NAND gate 331 receives a set pulse, its output goes high. When the NAND gate 332 receives a reset pulse, or when the fourth control signal PL₄ goes low, the output of the NAND , gate 331 goes low. The output of the NAND gate 331 is supplied to node N₈.

Next the operation of the memory in FIG. 3 will be described with reference to the waveforms in FIG. 4.

Figure 4:
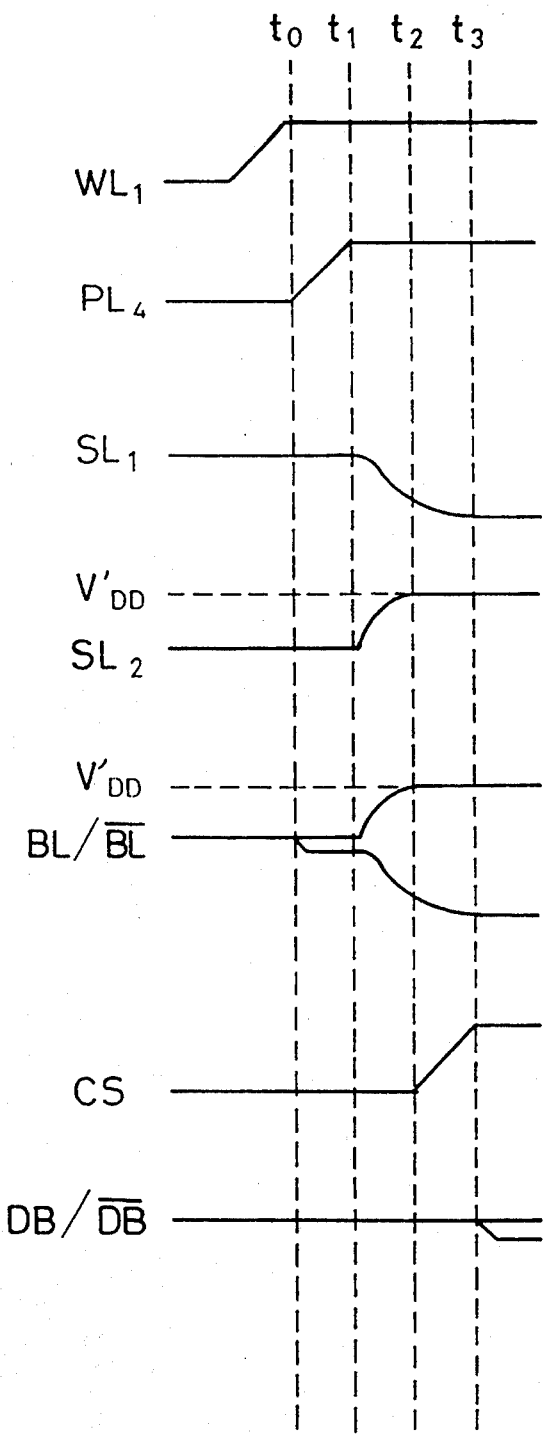
FIG. 4 is a timing diagram illustrating the operation of the memory in FIG. 2.

In the initial state in FIG. 4, the fourth control signal PL₄ is inactive (low), so the first and third control signals $\overline{PL_1}$ and $\overline{PL_3}$ are also inactive (high). As described above, when PL₄ is low the output of the flip-flop 330 at node N₈ is also low, so the second control signal PL₂ is inactive (low). The switching-element transistors 141, 142, and 314 are therefore all switched off, as are transistors 144 and 146, and the supply lines SL₁ and SL₂ are decoupled from the power supply control circuit 300. The supply lines SL₁ and SL₂ and bit lines BL and $\overline{BL}$ are precharged to V'$_{DD}$/2.

At time t₀ a word line (WL₁) is driven to the active state and a memory cell is coupled to one of the two bit lines BL and $\overline{BL}$, causing its potential to move away slightly from V'$_{DD}$.

At time t₁ the fourth control signal PL₄ becomes active (high), causing the first and third control signals $\overline{PL_1}$ and $\overline{PL_3}$ also to become active. The low-to-high transition of PL₄ furthermore triggers a set pulse from the one-shot circuit 340, which sets the flip-flop 330 to the high output state, so the second control signal PL₂ becomes active as well.

Transistors 141 and 142 now operate as they did in FIG. 1, causing the potentials of the first supply line SL₁ and second supply line SL₂ to diverge toward ground and V$_{DD}$ respectively at similar rates. In addition, the p-channel transistor 314 is turned on by the third control signal $\overline{PL_3}$, feeding V'$_{DD}$ to the second supply line SL₂.

While the potential of the second supply line SL₂ remains below V'$_{DD}$), the fifth control signal PL₅ output by the current-mirror amplifier 320 remains low, but when the potential of the second supply line SL₂ passes V'$_{DD}$ and moves further toward V$_{DD}$, the fifth control signal PL₅ goes high as explained above. This low-to-high transition of PL₅ triggers a reset pulse from the one-shot circuit 350 that resets the flip-flog 330, so that its output goes low. The second control signal PL₂ thus goes low, turning transistor 145 on the transistor 146 off. Transistor 142 accordingly turns off, stopping the supply of V$_{DD}$ to the second supply line SL₂. The second supply line SL₂ continues to receive V'$_{DD}$ through transistor 314.

While the supply lines SL₁ and SL₂ are diverging toward ground and V'$_{DD}$, respectively the bit lines BL and $\overline{BL}$ are similarly diverging. At time t₂ in FIG. 4 the second supply line SL₂ stabilizes at V'$_{DD}$. At time t₃ the column select signal CS becomes active and the bit line potentials are transferred to the data bus lines DB and $\overline{DB}$, as in FIG. 2.

The potential of the second supply line SL₂ need not necessarily surpass V'$_{DD}$ in order to turn off transistor 142. Depending on the values of V$_{DD}$ and V'$_{DD}$, the rise of the fifth control signal PL₅ may be sufficient to trigger a reset pulse from the one-shot circuit 350 even before SL₂ passes V'$_{DD}$, permitting the second supply line SL₂ to settle toward V'$_{DD}$ without overshoot. This is in fact the case illustrated in FIG. 4.

By using both V$_{DD}$ and V'$_{DD}$ to charge the second supply line SL₂, the memory in FIG. 3 enables SL₂ to reach V'$_{DD}$ more quickly than if it were being charged by V'$_{DD}$ alone. The added speed with which the second supply line $SL_2$ charges also helps the first supply line $SL_1$ to reach ground level more quickly, since the potential of the second supply line $SL_2$ controls the transistor 141 through which the first supply line $SL_1$ discharges. The coupling of the second supply line $SL_2$ to transistor 141 and of the first supply line $SL_1$ to transistor 142 furthermore causes the two supply lines $SL_1$ and $SL_2$ to charge and discharge in step with one another, as in the memory in FIG. 1.

This effect can be obtained even if the power supply control circuit is modified so that the potential of only one of the supply lines is used to control the switching element on the other line. For example, the circuit in FIG. 1 can be modified by eliminating p-channel transistor 145, n-channel transistor 146, and inverter 147, and coupling control signal $PL_2$ directly to the gate electrode of p-channel transistor 146, and inverter 147, and coupling control signal $\overline{PL_2}$ directly to the gate electrode of p-channel transistor 142. Then the charging of the second supply line $SL_2$ to $V_{DD}$ will be controlled only by $\overline{PL_2}$, and not by the potential of the first supply line $SL_1$, although the potential of $SL_2$ will still control the discharging of $SL_1$. This modification might be appropriate if it is known that control signal $PL_1$ will become active before $PL_2$, so that it is the discharging of $SL_1$, rather than the charging of $SL_2$, that needs to be delayed.

Similarly, in FIG. 3 transistors 145 and 146 can be eliminated and an inverter added on the $PL_2$ line, its input coupled to node $N_8$ and its output coupled to the gate electrode of p-channel transistor 142. The waveforms in FIGS. 2 and 4 can be viewed as being produced by these modified circuits.

Those skilled in the art will recognize that numerous other modifications to the circuits illustrated in FIGS. 1 and 3 can be made without departing from the scope of the invention as claimed below.

What is claimed is:

1. A method of supplying power to sense amplifiers in a semiconductor memory via a first supply line and a second supply line, comprising the steps of:
    coupling said first supply line to a first potential through a first switching element having a conductivity responsive to a potential of said second supply line; and
    coupling said second supply line to a second potential which is different from said first potential.

2. The method of claim 1, wherein said second supply line is coupled to said second potential through a second switching element having a conductivity responsive to a potential of said first supply line.

3. The method of claim 2, further comprising the step of coupling said second supply line to a third potential which is intermediate between said first potential and said second potential.

4. The method of claim 3, further comprising the step of decoupling said second supply line from said second potential when the potential of said second supply line becomes greater than said third potential.

5. A semiconductor memory, comprising:
    a plurality of bit lines;
    a plurality of memory cells, coupled to said bit lines, for storing data;
    a plurality of sense amplifiers, coupled to said bit lines, for amplifying potential differences between pairs of bit lines, said potential differences resulting from data stored in said memory cells;
    a first supply line coupled to supply a first potential to said sense amplifiers;
    a second supply line coupled to supply a second potential to said sense amplifiers; and
    a first switching element coupled to supply said first potential to said first supply line in response to a potential of said second supply line, a conductivity of said first switching element increasing as the potential of said second supply line increases toward said second potential.

6. The memory of claim 5, wherein said first switching element is a first n-channel transistor having a source electrode coupled to receive said first potential, a drain electrode coupled to said first supply line, and a gate electrode coupled to a first node.

7. The memory of claim 6, further comprising a first switching circuit controlled by a first control signal having an active state and an inactive state, for coupling said first node to said first potential when said first control signal is inactive, and to said second supply line when said first control signal is active.

8. The memory of claim 7, wherein said first switching circuit comprises:
    a second n-channel transistor having a gate electrode coupled to receive said first control signal, a source electrode coupled to said first potential, and a drain electrode coupled to said first node; and
    a first p-channel transistor having a gate electrode coupled to receive said first control signal, a source electrode coupled to said second supply line, and a drain electrode coupled to said first node.

9. The memory of claim 5, further comprising:
    a second switching element coupled to supply said second potential to said second supply line in response to a potential of said first supply line, a conductivity of said second switching element increasing as the potential of said first supply line increases toward said first potential.

10. The memory of claim 9, wherein said second switching element is a second p-channel transistor having a source electrode coupled to receive said second potential, a drain electrode coupled to said second supply line, and a gate electrode coupled to a second node.

11. The memory of claim 10, further comprising a second switching circuit controlled by a second control signal having an active state and an inactive state, for coupling said second node to said second potential when said second control signal is inactive, and to said first supply line when said second control signal is active.

12. The memory of claim 11, wherein said second switching circuit comprises:
    a third p-channel transistor having a gate electrode coupled to receive said second control signal, a source electrode coupled to said second potential, and a drain electrode coupled to said second node; and
    a third n-channel transistor having a gate electrode coupled to receive said second control signal, a source electrode coupled to said first supply line, and a drain electrode coupled to said second node.

13. The memory of claim 11, further comprising a third switching element controlled by a third control signal having an active state and an inactive state, for coupling said second supply line to a third potential which is intermediate between said first potential and said second potential when said third control signal is active.

14. The memory of claim 13, wherein said third switching element is a fourth p-channel transistor having a source electrode coupled to receive said third potential, a drain electrode coupled to said second supply line, and a gate electrode coupled to receive said third control signal.

15. The memory of claim 14, wherein said third control signal is generated from a fourth control signal having an active state and an inactive state, said third control signal being active when said fourth control signal is active, and said first switching element is switched off when said fourth control signal is inactive.

16. The memory of claim 15, further comprising:
a current-mirror amplifier coupled to said second supply line, for generating a fifth control signal having an active state and an inactive state, said fifth control signal being inactive when the potential of said second supply line is between said first potential and said third potential, and active when the potential of said second supply line is greater than said third potential;
a first one-shot circuit coupled to generate a set pulse at an inactive-to-active transition of said fourth control signal;
a second one-shot circuit coupled to generate a reset pulse at an inactive-to-active transition of said fifth control signal; and
a set-reset flip-flop coupled to receive said set pulse, said reset pulse, and said fourth control signal, and to generate said second control signal by making said second control signal inactive when said fourth control signal is inactive, active when said set pulse is received, and inactive when said reset pulse is received.

17. The memory of claim 5, wherein the first switching element is a first transistor having a first electrode coupled to receive the first potential, a second electrode coupled to the first supply line, and a control electrode coupled to a first node.

18. The memory of claim 17, further comprising a first switching circuit controlled by a first control signal having an active state and an inactive state, for coupling the first node to the first potential when the first control signal is inactive, and to the second supply line when the first control signal is active.

19. The memory of claim 18, wherein the first switching circuit comprises:
a second transistor having a control electrode coupled to receive the first control signal, a first electrode coupled to the first potential, and a second electrode coupled to the first node; and
a third transistor having a control electrode coupled to receive the first control signal, a first electrode coupled to the second supply line, and a second electrode coupled to the first node.

20. The memory of claim 9, wherein the second switching element is a fourth transistor having a first electrode coupled to receive the second potential, a second electrode coupled to the second supply line, and a control electrode coupled to a second node.

21. The memory of claim 20, further comprising a second switching circuit controlled by a second control signal having an active state and an inactive state, for coupling the second node to the second potential when the second control signal is inactive, and to the first supply line when the second control signal is active.

22. The memory of claim 21, wherein the second switching circuit comprises:
a fourth transistor having a control electrode coupled to receive the second control signal, a first electrode coupled to the second potential, and a second electrode coupled to the second node; and
a sixth transistor having a gate electrode coupled to receive the second control signal, a first electrode coupled to the first supply line, and a second electrode coupled to the second node.

23. The memory of claim 21, further comprising a third switching element controlled by a third control signal having an active state and an inactive state, for coupling the second supply line to a third potential which is intermediate between the first potential and the second potential when the third control signal is active.

24. The memory of claim 23, wherein the third switching element is a seventh transistor having a first electrode coupled to receive the third potential, a second electrode coupled to the second supply line, and a control electrode coupled to receive the third control signal.

25. The memory of claim 24, wherein the third control signal is generated from a fourth control signal having an active state and an inactive state, the third control signal being active when the fourth control signal is active, and the first switching element is switched off when the fourth control signal is inactive.

26. The memory of claim 25, further comprising:
a current-mirror amplifier coupled to the second supply line, for generating a fifth control signal having an active state and an inactive state, the fifth control signal being inactive when the potential of the second supply line is between the first potential and the third potential, and active when the potential of the second supply line is greater than the third potential;
a first one-shot circuit coupled to generate a set pulse at an inactive-to-active transition of the fourth control signal;
a second one-shot circuit coupled to generate a reset pulse at an inactive-to-active transition of the fifth control signal; and
a set-reset flip-flop coupled to receive the set pulse, the reset pulse, and the fourth control signal, and to generate the second control signal by making the second control signal inactive when the fourth control signal is inactive, active when the set pulse is received, and inactive when the reset pulse is received.

27. A method of supplying power to a sense amplifier of a semiconductor memory through a first supply line and a second supply line, comprising the steps of:
coupling a first supply line to a first power supply having a first potential through a first switching circuit controlled by a potential of the second supply line; and
coupling the second supply line to a second power supply having a second potential.

28. The method of claim 27, wherein the second supply line is coupled to the second power supply through a second switching circuit controlled by a potential of the first supply line.

29. The method of claim 28, further comprising the steps of coupling the second supply line to a third power supply having a third potential which is intermediate between the first potential and the second potential.

30. The method of claim 29, further comprising the step of decoupling the second supply line from the second potential when the potential of the second supply line becomes greater than the third potential.

31. A semiconductor memory, comprising:
   a pair of bit lines;
   a memory cell, coupled to the bit lines, for storing data;
   a sense amplifier, coupled to the bit lines, for amplifying a potential difference between the pair of bit lines;
   a first supply line, coupled to a first power supply having a first potential, for supplying the first potential to the sense amplifier;
   a second supply line, coupled to a second power supply having a second potential, for supplying the second potential to the sense amplifier; and
   a first switching circuit, controlled by a potential of the second supply line, for coupling the first power supply to the first supply line in response to the potential of the second supply line.

32. The memory according to claim 31, wherein the first switching element is a first transistor having a first electrode coupled to receive the first potential, a second electrode coupled to the first supply line, and a control electrode coupled to a first node.

33. The memory according to claim 32, further comprising a first switching circuit controlled by a first control signal having an active state and an inactive state, for coupling the first node to the first potential when the first control signal is inactive, and to the second supply line when the first control signal is active.

34. The memory according to claim 33, wherein the first switching circuit comprises:
   a second transistor having a control electrode coupled to receive the first control signal, a first electrode coupled to the first potential, and a second electrode coupled to the first node; and
   a third transistor having a control electrode coupled to receive the first control signal, a first electrode coupled to the second supply line, and a second electrode coupled to the first node.

35. The memory according to claim 31, further comprising:
   a second switching element coupled to supply the second potential to the second supply line in response to a potential of the first supply line, a conductivity of the second switching element increasing as the potential of the first supply line increases toward the first potential.

36. The memory according to claim 35, wherein the second switching element is a fourth transistor having a first electrode coupled to receive the second potential, a second electrode coupled to the second supply line, and a control electrode coupled to a second node.

37. The memory according to claim 36, further comprising a second switching circuit controlled by a second control signal having an active state and an inactive state, for coupling the second node to the second potential when the second control signal is inactive, and to the first supply line when the second control signal is active.

38. The memory according to claim 37, wherein the second switching circuit comprises:
   a fifth transistor having a control electrode coupled to receive the second control signal, a first electrode coupled to the second potential, and a second electrode coupled to the second node; and
   a sixth transistor having a control electrode coupled to receive the second control signal, a first electrode coupled to the first supply line, and a second electrode coupled to the second node.

39. The memory according to claim 38, further comprising a third switching element controlled by a third control signal having an active state and an inactive state, for coupling the second supply line to a third potential which is intermediate between the first potential and the second potential when the third control signal is active.

40. The memory according to claim 39, wherein the third switching element is a seventh transistor having a first electrode coupled to receive the third potential, a second electrode coupled to the second supply line, and a control electrode coupled to receive the third control signal.

41. The memory according to claim 40, wherein the third control signal is generated from a fourth control signal having an active state and an inactive state, the third control signal being active when the fourth control signal is active, and the first switching element is switched off when the fourth control signal is inactive.

42. The memory according to claim 41, further comprising:
   a current-mirror amplifier coupled to the second supply line, for generating a fifth control signal having an active state and an inactive state, the fifth control signal being inactive when the potential of the second supply line is between the first potential and the third potential, and active when the potential of the second supply line becomes greater than the third potential;
   a first one-shot circuit coupled to generate a set pulse at an inactive-to-active transition of the fourth control signal;
   a second one-shot circuit coupled to generate a reset pulse at an inactive-to-active transition of the fifth control signal; and
   a set-reset flip-flop coupled to receive the set pulse, the reset pulse, and the fourth control signal, and to generate the second control signal by making the second control signal inactive when the fourth control signal is inactive, active when the set pulse is received, and inactive when the reset pulse is received.

* * * * *